(12) United States Patent
Baba

(10) Patent No.: US 7,979,736 B2
(45) Date of Patent: Jul. 12, 2011

(54) METHOD FOR UPDATING NONVOLATILE MEMORY

(75) Inventor: Tsutomu Baba, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 730 days.

(21) Appl. No.: 11/805,519

(22) Filed: May 23, 2007

(65) Prior Publication Data

US 2007/0288809 A1  Dec. 13, 2007

(30) Foreign Application Priority Data

May 24, 2006 (JP) ................................ 2006-143926

(51) Int. Cl.
*G06F 11/00* (2006.01)
(52) U.S. Cl. .............................. 714/6.1; 714/5.1; 714/42
(58) Field of Classification Search ................. 714/5, 42, 714/5.1, 6.1, 6.11, 6.2
See application file for complete search history.

(56) References Cited

U.S. PATENT DOCUMENTS

| | | | |
|---|---|---|---|
| 6,978,342 B1 * | 12/2005 | Estakhri et al. | 711/103 |
| 2005/0060602 A1 * | 3/2005 | Battaia | 714/5 |
| 2005/0081085 A1 * | 4/2005 | Ellis et al. | 714/5 |
| 2006/0101304 A1 * | 5/2006 | Miura | 714/5 |
| 2006/0206536 A1 * | 9/2006 | Sawdon et al. | 707/200 |

FOREIGN PATENT DOCUMENTS

JP  08-287697  1/1996

* cited by examiner

*Primary Examiner* — Scott T Baderman
*Assistant Examiner* — Sarai Butler
(74) *Attorney, Agent, or Firm* — Frommer Lawrence & Haug LLP

(57) ABSTRACT

A memory block having a plurality of parameter data including parameter data to be updated is read to a working area from a nonvolatile memory and, whether the plurality of parameter data is correct or not is checked on a basis of error detection data. When an error is detected, temporary updating data are generated in a working area by updating the parameter data to be updated to a specified parameter data and by updating data except the parameter data to be updated to an unspecified data that have no meaning, and then the temporary updating data are written into the nonvolatile memory.

5 Claims, 6 Drawing Sheets

EEPROM

| 1block (16bytes) |
|---|
| 1block (16bytes) |
| 1block (16bytes) |
| ⋮ |
| 1block (16bytes) |
| 1block (16bytes) |

Fig. 1 (a)

Enlarged 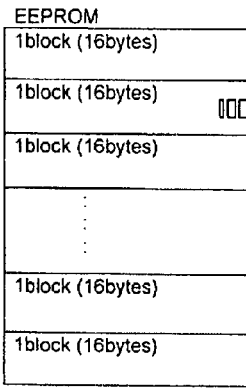

1block (16bytes) — Area Storing Number of Times of Retry for Respective Functions

| Number of times of take-in retry (1byte) | : 4 |
|---|---|
| Number of times of ejection retry (1byte) | : 4 |
| Number of times of capture retry (1byte) | : 3 |
| Number of times of forward carrying retry (1byte) | : 3 |
| Number of times of backward carrying retry (1byte) | : 3 |
| Number of times of magnetic read retry (1byte) | : 5 |
| Number of times of magnetic write retry (1byte) | : 5   Damaged → 20 |
| Number of times of shutter open retry (1byte) | : 3 |
| Number of times of shutter close retry (1byte) | : 3 |
| Number of times of IC contact ON retry (1byte) | : 2 |
| Number of times of IC contact OFF retry (1byte) | : 2 |
| 0xFF (unwritten state) | |
| 0xFF (unwritten state) | |
| 0xFF (unwritten state) | |
| CRC (2bytes) | |

Fig. 1 (b)

Read out 1-Block to Working Area of RAM to Update
Number of Times of Ejection Retry from "4" to "6"
→ CRC Error Occurs

Fig. 1 (c)

RAM Working Area
Update Number of Times of Ejection Retry from "4" to "6".
Other Parameters are rewritten to "0xFF". CRC is recalculated.

EEPROM

| 1block (16bytes) |
|---|
| 1block (16bytes) |
| 1block (16bytes) |
| ⋮ |
| 1block (16bytes) |
| 1block (16bytes) |

Fig. 1 (e)

Write into EEPROM 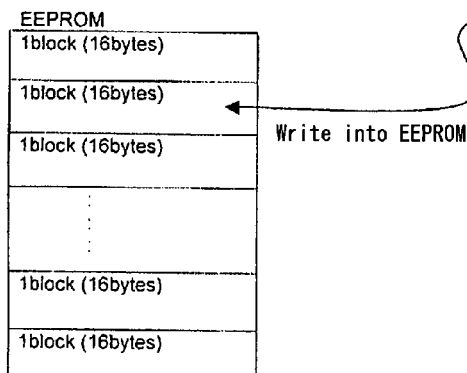

| Number of times of take-in retry (1byte) | : 0xFF |
|---|---|
| Number of times of ejection retry (1byte) | : 6 |
| Number of times of capture retry (1byte) | : 0xFF |
| Number of times of forward carrying retry (1byte) | : 0xFF |
| Number of times of backward carrying retry (1byte) | : 0xFF |
| Number of times of magnetic read retry (1byte) | : 0xFF |
| Number of times of magnetic write retry (1byte) | : 0xFF |
| Number of times of shutter open retry (1byte) | : 0xFF |
| Number of times of shutter close retry (1byte) | : 0xFF |
| Number of times of IC contact ON retry (1byte) | : 0xFF |
| Number of times of IC contact OFF retry (1byte) | : 0xFF |
| 0xFF | |
| 0xFF | |
| 0xFF | |
| CRC (2bytes)  Recalculated based on Above Data | |

Fig. 1 (d)

Fig. 1 (f) 
Notify High-Order Device of
Data Updating Normally Finished Fig. 1 (g) 
Magnetic Write Command
→ Notify Operation Parameter
Unspecified Error Fig. 1 (h)
Notify Operation Parameter Unspecified Error
until Number of Times
of Magnetic Write Retry are set.

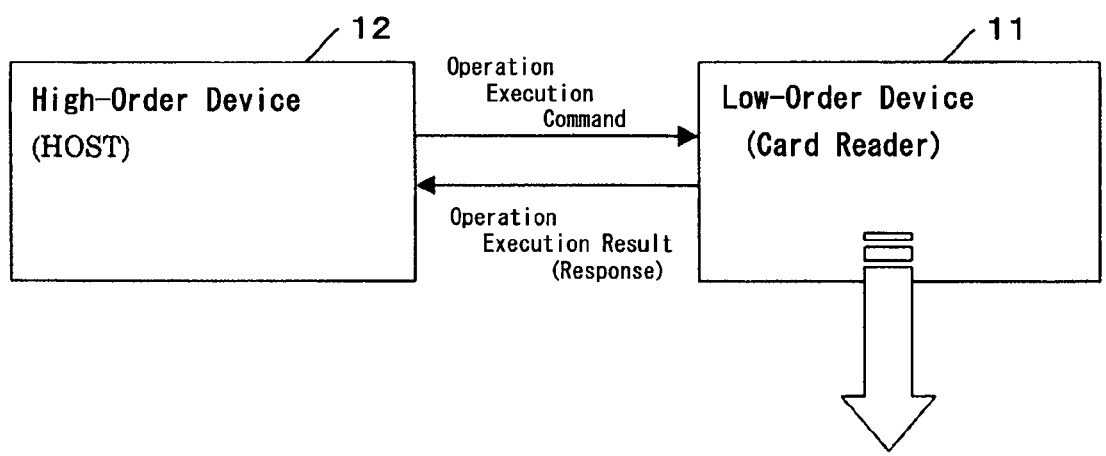
Fig. 3
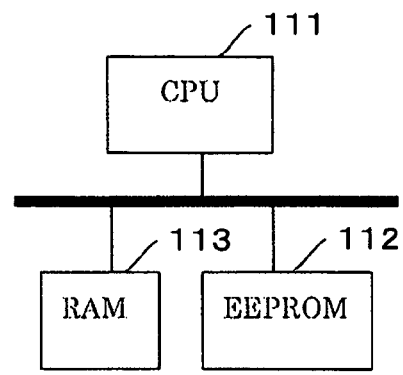

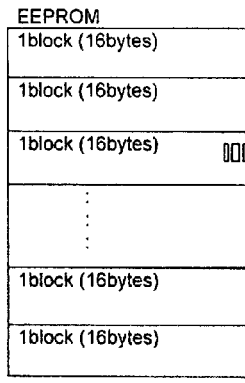

Fig. 6(a)

1block (16bytes)
Area Storing Parameters for Data Processing of IC Card

| IC Card Standard Selection (1 byte) | : 1 | |
|---|---|---|
| SAM Standard Selection (1 byte) | : 1 | |
| Applied Voltage Selection (1 byte) | : 3 | Damaged → 5 |
| 0xFF (unwritten state) | | |
| 0xFF (unwritten state) | | |
| 0xFF (unwritten state) | | |
| 0xFF (unwritten state) | | |
| 0xFF (unwritten state) | | |
| 0xFF (unwritten state) | | |
| 0xFF (unwritten state) | | |
| 0xFF (unwritten state) | | |
| 0xFF (unwritten state) | | |
| 0xFF (unwritten state) | | |
| CRC (2bytes) | | |

Fig. 6(b)

Read out 1-Block
to Working Area of RAM to Update
SAM Standard from "1" to "2".
→ CRC Error Occurs.

Fig. 6(c)

RAM Working Area
Update SAM Standard from "1" to "2".
Other Parameters are rewritten to "0xFF". CEC is recalculated.

| IC Card Standard Selection (1 byte) |
|---|
| SAM Standard Selection (1 byte) |
| Applied Voltage Selection (1 byte) |
| 0xFF |
| 0xFF |
| 0xFF |
| 0xFF |
| 0xFF |
| 0xFF |
| 0xFF |
| 0xFF |
| 0xFF |
| 0xFF |
| 0xFF |
| CRC (2bytes)  Recalculated based on Above Data |

Fig. 6(d)

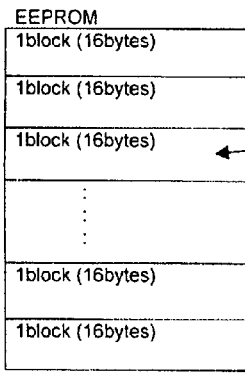

Write into EEPROM

Fig. 6(e)

Fig. 6(f)
Notify High-Order Device
of Data Updating Normally Finished

Fig. 6(g)
IC Card Data Processing Command
→ Notify Operation Parameter
Unspecified Error Fig. 6(h)
Notify Operation Parameter
Unspecified Error
until Selections of IC Card Standard
and Applied Volatge are set.

METHOD FOR UPDATING NONVOLATILE MEMORY

CROSS REFERENCE TO RELATED APPLICATION

The present invention claims priority under 35 U.S.C. §119 to Japanese Application No. 2006-143926 filed May 24, 2006, which is incorporated herein by reference.

FIELD OF THE INVENTION

The present invention relates to a method for updating a nonvolatile memory such as an EEPROM and specifically, the present invention relates to a method for updating a nonvolatile memory which is capable of improving system reliability.

BACKGROUND OF THE INVENTION

A nonvolatile memory (for example, an EEPROM or a flash memory) has been conventionally utilized as a memory which is capable of retaining stored contents even when power supply is cut off and, in addition, which is capable of electrically rewriting the stored content (see, for example, Japanese Patent Laid-Open No. Hei 8-287697). In the nonvolatile memory, due to its properties, even when a part of the data (for example, several bytes of 16 bytes) is to be updated, it is required to rewrite the entire block of data (that is, all 16 bytes). In other words, one entire block in a nonvolatile memory is temporarily copied in a RAM and, after a part of data in the block is rewritten on a RAM, the entire block where rewriting has been finished is rewritten in the nonvolatile memory. In this case, since validity of data in each of the block units is required to control when the block unit has been rewritten, in order to recognize whether data are correctly rewritten or not, error detection data such as CRC or BCC are commonly written into the block simultaneously.

Systems have been known in which a high-order device or a host device such as an ATM sends an execution command for processing to a low-order device such as a card reader, which receives the command, executes the processing and notifies its processing result to the high-order device. In this system, the low-order device is provided with a nonvolatile memory which retains data for setting various functional operations in the low-order device such as a number of times of ejection retry and a number of times of magnetic read retry. The low-order device is structured to execute the respective functional operations on the basis of the data. The high-order device is provided with commands for writing data (data updating command) for setting various functional operations of the low-order device into the nonvolatile memory.

In the system described above, when the low-order device receives a command for updating certain data in the nonvolatile memory from the high-order (host) device, an entire block including the corresponding data is developed (or read out) on a RAM in order to update corresponding data in the nonvolatile memory and an error detection data of the block is checked. At this time, there may be a case when the error detection data of the block is detected as an error and data in the block may be damaged by a certain cause. However, it cannot be judged which data are damaged in the block.

In the situation described above, for example, in a case that only data to be updated are overwritten (rewritten) in the block which is read out from the nonvolatile memory and, after the error detection data are also recalculated and updated (rewritten) on the basis of the block after having been updated, the entire block after having been rewritten is overwritten at the original position in the nonvolatile memory, there may cause a malfunction in the low-order device. In other words, when data except a part of the data to be updated were damaged to cause an error, the error data are regarded as a correct value and are written into the nonvolatile memory. For example, although data of 4-times are a correct value, error data of 20-times are regarded as a correct value which was written into the nonvolatile memory. In addition, the error detection data are also calculated based on the value and are rewritten into the nonvolatile memory. Therefore, a function which is operated on the basis of the data (for example, ejection retry or magnetic read retry) will be operated on the basis of the error data (for example, error data of 20-times). Therefore, in the worst case, there is a possibility that an object to be treated in the low-order device may be damaged. For example, 4-times of ejection retry does not cause a problem but, when an ejection retry is executed 20-times, card deterioration due to abrasion may occur.

In order to prevent this problem, a conventional system has been commonly structured in which, when error detection data of a block developed on a RAM are detected as an error, all data of the block are rewritten to initial values (default value such as a shipping value or standard value) and a notice of having detected with an error at the time of data updating is sent to the high-order device to request so as to update all data in the corresponding block.

However, the conventional system as described above has following problems.

First, the host device which has received a notice of error with respect to a data writing command to be requested updating of all data of the corresponding block so as to be rewritten to initial values is required to immediately update data of the corresponding block to the initial values. For example, when a system operation is continued with data of the initial value as they are without immediately updating data of the corresponding block (without updating data of the initial value to original proper data), a function being operated on the basis of data in the corresponding block will be operated on the basis of the data of the initial value. As an example, although the value of 4-times is an original correct value but the function is operated on the basis of the initial value, i.e., 2-times. In this case, it may not cause a serious malfunction but an operation has been continued in a state which is different from an originally expected operation, for example, in a state where the number of times of retry is 2-times instead of 4-times. As a result, the system may be deteriorated in a low reliability such that an unanticipated error is notified to the high-order device. For example, in a system which is structured such that the high-order device is originally to be notified with an error through 4-times retry, an error is notified to the high-order device when a retry is performed only two times based on the initial value. Therefore, as described above, data of the corresponding block have to be updated to original data immediately, but actually, there are some high-order devices which are unable to operate in such a rapid manner.

Further, even when the high-order device is capable of immediately updating data of the corresponding block to the original data, in a case that the updating operation is suspended due to a trouble (system down, for example) while data of the corresponding block are being updated by respective commands one by one, an error cannot be detected when respective functions are executed because the error detection data have been normally and correctly written, in other words, the error detection data are recalculated and updated whenever the respective data of the corresponding block are updated by respective commands one by one. Accordingly, there is no means for recognizing that the data had been on the way of being updated. Under the state as described above, although functions being operated with the initial values without having been updated and functions being correctly operated with data after having been updated are coexisted with each other, operations are continued. As a result, similarly to the above-mentioned case, reliability of the system may be reduced until the data of the corresponding block are updated to the original data, or an unanticipated error may be informed to the high-order device.

SUMMARY OF THE INVENTION

In view of the problems described above, an embodiment of the present invention may advantageously provide a method for updating a nonvolatile memory which is capable of preventing system operation from continuing with initial values and of realizing a system having a high reliability.

Thus, according to an embodiment of the present invention, there may be provided an method for updating a nonvolatile memory as described in the following examples.

Specifically, in accordance with one embodiment of the inventions, a method for updating a nonvolatile memory is disclosed having a memory block which has stored a plurality of parameter data which corresponds to a plurality of parameters for controlling operation of a low-order device and which is capable of being updated based on a command from a high-order device, and error detection data for detecting whether the plurality of parameter data is correct or not, wherein one of the plurality of parameter data is updated. This method comprises a number of steps, including:
  a first step in which the memory block including the parameter data to be updated is read to a working area from the nonvolatile memory on a basis of a parameter updating command from the high-order device;
  a second step which detects whether the plurality of parameter data in the memory block that is read through the first step is correct or not on a basis of the error detection data;
  a third step which is executed when an error is detected in the second step to generate temporary updating data in the working area by updating the parameter data to be updated to a specified parameter data and by updating data except the parameter data to be updated to an unspecified data;
  a fourth step which is executed when the error is not detected in the second step to generate normal updating data in the working area by updating only the parameter data to be updated to the specified parameter data;
  a fifth step in which the temporary updating data generated through the third step or the normal updating data through the fourth step are written into the nonvolatile memory; and
  a sixth step which is executed after the fifth step has been finished to notify the high-order device of having finished of the parameter updating.

According the example described above, in an method for updating a nonvolatile memory such as an EEPROM, a memory block including the parameter data to be updated is read to a working area such as a RAM from the nonvolatile memory, and it is detected that whether the plurality of parameter data is correct or not. When an error is detected, temporary updating data are generated by updating the parameter data to be updated to a specified parameter data and by updating data except the parameter data to be updated to an unspecified data. On the other hand, when the error is not detected, normal updating data are generated by updating only the parameter data to be updated to the specified parameter data. Then, the temporary updating data or the normal updating data are written into the nonvolatile memory and a notice of having finished of the parameter updating is sent to the high-order device from the low-order device.

Therefore, for example, in a case of a high-order device which is unable to immediately update data of corresponding block, which have been rewritten to initial values, to original specified data when the high-order device has received an error notice with respect to a data writing command, system operation has been conventionally continued with the initial values and thus an unanticipated error may be notified to the high-order device, which may deteriorate the system in a low reliability. However, according to the above-mentioned example, when the error is detected, the temporary updating data which are not the initial values are written to the nonvolatile memory. Therefore, system operation is prevented from being continued with the initial values like the conventional case and thus a system having high reliability can be realized.

Further, for example, even in a case of a high-order device which is capable of immediately updating data of corresponding block, which have been rewritten to initial values, to original specified data when the high-order device has received an error notice with respect to a data writing command, in the conventional case when updating processing is suspended due to a system down or the like, system operation is continued with the initial values and thus an unanticipated error may be notified to the high-order device, which causes to deteriorate the system in low reliability. However, according to the above-mentioned example, when the error is detected, the temporary updating data which do not include the initial values are written to the nonvolatile memory. Therefore, system operation is prevented from being continued with the initial values like the conventional case and thus a system having high reliability can be realized.

In accordance with this embodiment of the invention, "unspecified data" are data which have no meaning as a parameter for controlling operation of a low-order device. Therefore, for example, data such as "0000" or "0xFF" are adopted. Alternatively, for example, even in the data of "0010", the data which do not have a meaning as the parameter for controlling operation of the low-order device may be included in the "unspecified data".

It should also be noted that, in the third step of this embodiment of the invention, "data except the parameter data to be updated are updated to an unspecified data". In this case, the "data except the parameter data to be updated" may not include the "error detection data" and data whose necessity for updating to the unspecified data is low.

In accordance with another embodiment of the invention, a method for updating a nonvolatile memory is disclosed which may further comprise additional steps including:
  a seventh step which is executed after the sixth step has been finished and on a basis of an operation command that is received with the low-order device from the high-order device to read a memory block including a parameter data for the operation command from the nonvolatile memory into a prescribed working area;
  an eighth step which detects whether the plurality of parameter data in the memory block that is read through the seventh step is correct or not on a basis of the error detection data; and
  a ninth step which judges whether the parameter data for the operation command is the unspecified data or not.

In this embodiment, when an error is detected in the eighth step, the low-order device may require a specified parameter data for the operation command to the high-order device and receives and updates to the specified parameter data, and data except the specified parameter data are updated with unspecified data and, when the parameter data for the operation command are judged as the unspecified data in the ninth step, the low-order device may require a specified parameter data for the operation command to the high-order device and receives the specified parameter data and then only the specified parameter data are updated. In accordance with an embodiment, when an error is detected in the eighth step or, when the parameter data for the operation command are judged as the unspecified data in the ninth step, the low-order device may require a specified parameter data for the operation command to the high-order device, and then the first step, the second step, the third step or the fourth step, the fifth step and the sixth step are successively executed. In this case, a system having a further high reliability can be realized.

According to the embodiment described above, after "notice of updating of the parameter having been finished" is sent to the high-order device from the low-order device, an operation command is sent from the high-order device to the low-order device, a memory block including the parameter data for the operation command is read to a working area such as a RAM from the nonvolatile memory, it is detected that whether the plurality of parameter data is correct or not and it is judged that whether the parameter data for the operation command is the unspecified data or not. When an error is detected, or when the parameter data for the operation command are judged as the unspecified data, the first step through the sixth step (either of the third step and the fourth step) are successively executed. Therefore, when an operation command is sent from the high-order device to the low-order device, the unspecified data are updated to a normal data.

Accordingly, system operation are continued with normal data without using the initial values and thus a system having high reliability can be realized.

In accordance with another embodiment of the invention, all unspecified data for operation command may be updated to the specified parameter data.

According to this embodiment, updating processing is repeatedly performed until all the unspecified parameter data for operation command have been updated to the specified data. Therefore, operation of the low-order device can be normally controlled while maintaining a high reliability.

In accordance with yet another embodiment of the invention, the unspecified data may be data of "0xFF".

According to this embodiment of the invention, the unspecified data are data of "0xFF" which have no meaning as a parameter for controlling operation of the low-order device and thus versatility of the system can be enhanced.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIGS. 1(a) through 1(h) are explanatory schematic views showing a method for updating a nonvolatile memory in accordance with an embodiment of the present invention.

FIGS. 2(a) through 2(f) are explanatory schematic views showing a conventional method for updating a nonvolatile memory.

FIG. 3 is a block diagram showing an electrical structure of a card reader having a nonvolatile memory in accordance with an embodiment of the present invention.

FIGS. 6(a) through 6(h) are explanatory schematic views showing a method for updating a nonvolatile memory in accordance with another embodiment of the present invention.

DETAILED DESCRIPTION OF THE PREFERRED EMBODIMENTS

Figure 4:
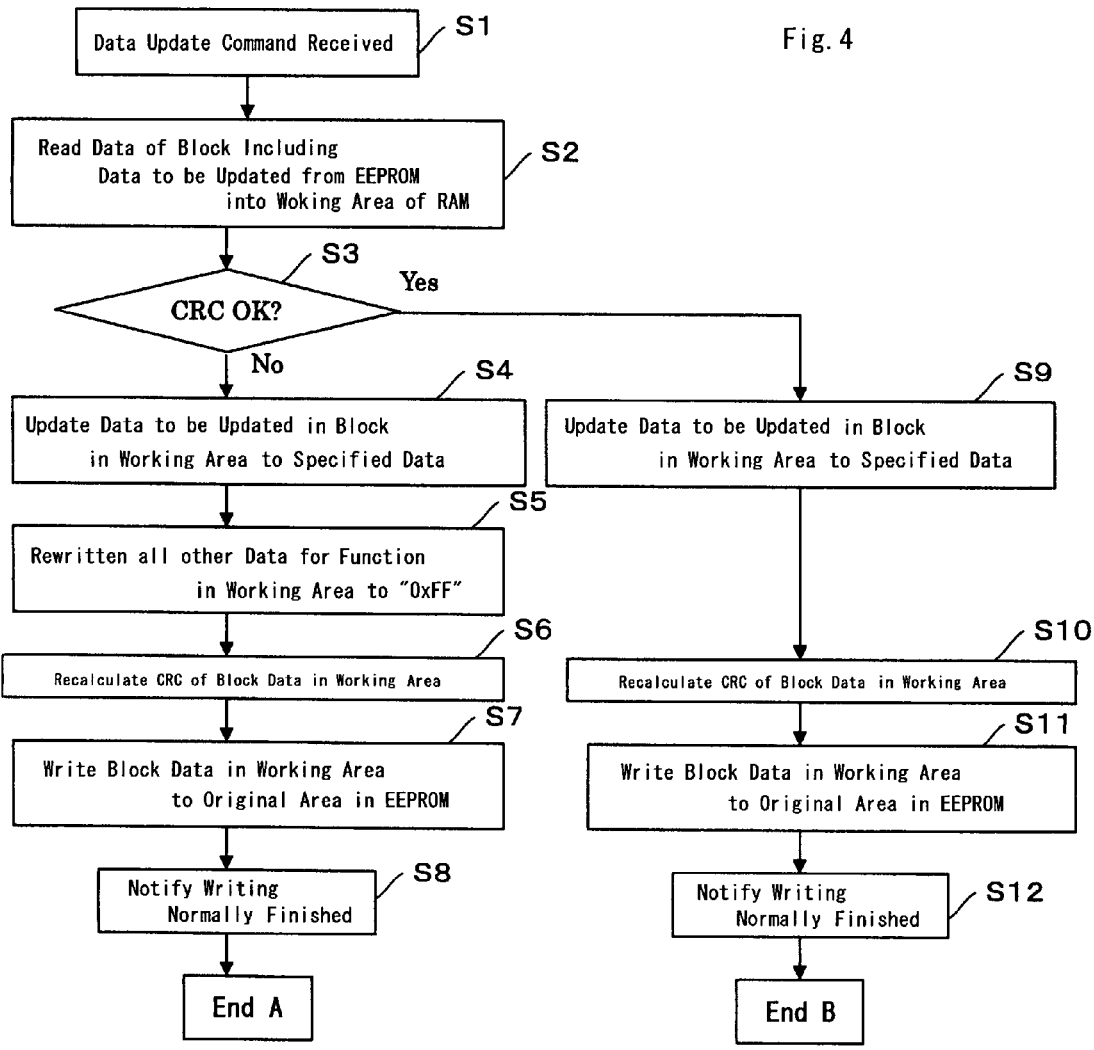
FIG. 4 is a flow chart showing a method for updating a nonvolatile memory in accordance with an embodiment of the present invention.

An embodiment of the present invention will be described below with reference to the accompanying drawings.

FIGS. 1(a) through 1(h) are explanatory schematic views showing a method for updating a nonvolatile memory in accordance with an embodiment of the present invention.

As shown in FIGS. 1(a) through 1(h), a memory area of an EEPROM includes a plurality of blocks each of which is comprised of a rewriting minimum unit (16 bytes) (see FIG. 1(a)). FIG. 1(b) is an example view that shows one of the blocks. The block shown in FIG. 1(b) is an area in which the number of times of retry for respective functions is stored, for example, as follows:

Number of times of take-in retry: 4
Number of times of ejection retry: 4
Number of times of capture retry: 3
Number of times of forward carrying retry: 3
Number of times of backward carrying retry: 3
Number of times of magnetic read retry: 5
Number of times of magnetic write retry: 5
Number of times of shutter open retry: 3
Number of times of shutter close retry: 3
Number of times of IC contact ON retry: 2
Number of times of IC contact OFF retry: 2

Besides, CRC: Cyclic Redundancy Check (error detection data) is stored. "0xFF" is stored in a memory area in an unwritten state.

In the state as described above, it is assumed as an example that, after data damage have occurred in the number of times of magnetic write retry (five times) and have changed to a wrong value of twenty times, a write command (data updating command) for updating the number of times of ejection retry (four times) to six times is sent to a low-order device 11 from a high-order device 12 (see FIG. 3).

The low-order device 11 which has received the data updating command (four times→six times) has developed or read out an entire block (see FIG. 1(b)) where the number of times of ejection re-try is stored to a RAM 113 (see FIG. 3) and then the CRC is checked. In this case, as described above, since the number of times of magnetic write retry is a wrong number (twenty times), the check result of the CRC becomes an error (see FIG. 1(c)).

After the CRC error has been found, the low-order device 11 updates the number of times of ejection retry to six times from four times and updates all parameters other than the number of times of ejection retry to "0xFF" (an example of unspecified data). In addition, the CRC is also recalculated and updated on the basis of the data after having been updated. As a result, as shown in FIG. 1(d), the value of six times is stored as the number of times of ejection retry and the value of "0xFF" is stored in all of the remaining memory areas other than the CRC.

After that, the low-order device 11 writes the block contents shown in FIG. 1(d) into the prescribed position of the EEPROM (original memory area) (see FIG. 1(e)), and then the low-order device 11 notifies the high-order device 12 of the data updating normally finished (see FIG. 1(f)). This notice of the data updating normally finished is different from the notice of the CRC error to the high-order device 12.

As described above, while system operation has been continued based on the block contents shown in FIG. 1(d), it is assumed as an example that a magnetic write command is sent to the low-order device 11 from the high-order device 12. At this time, the number of times of magnetic write retry is read out in order to confirm how many times of magnetic write retry are permitted. However, as described above, the value of "0xFF" is stored in the memory area of the EEPROM where the number of times of magnetic write retry is to be stored and thus the parameter indicating the number of times is not stored. Therefore, the low-order device 11 notifies the high-order device 12 of an unspecified error wherein the number of times of magnetic write retry is not set. (see FIG. 1(g)).

The high-order device 12 which has received this unspecified error notice sends a writing command (data updating command) for updating the number of times of magnetic write retry to five times, which is a correct value, from the current value of "0xFF" to the low-order device 11. The low-order device 11 continues to notify the high-order device 12 of the unspecified error wherein the number of times of magnetic write retry is not set until the number of times of magnetic write retry is set as five times by the writing command (see FIG. 1(h)). The high-order device 12 sends the writing command (data updating command) for updating the number of times of magnetic write retry to five times from the current value of "0xFF" to the low-order device 11 and, when the updating has been normally and correctly performed, the magnetic write command is executed.

In this embodiment, the data which are updated by this writing command are only the number of times of magnetic write retry and thus "0xFF" is stored as the numbers of times of other retries. Further, with respect to the numbers of times of other retries, a writing command is sent from the high-order device 12 when the number of times of respective retries has been read out and, at that time, the number of times is set to a correct value.

According to a method for updating a nonvolatile memory in accordance with this embodiment of the invention, system operation is prevented from continuing with initial values and thus a system with high reliability can be realized. Specifically, in the conventional updating method, as shown in FIGS. 2(a) through 2(f), after the CRC error has been found, all data of the block are rewritten to the initial values (see FIG. 2(d). FIG. 2(a) through FIG. 2(c) are the same as FIG. 1(a) through FIG. 1(c)). The CRC is recalculated on the basis of these initial values and updated, and then the block contents shown in FIG. 2(d) are written to the prescribed position (original memory area) of the EEPROM again (FIG. 2(e)). And, a CRC error is notified to the high-order device 12 (see FIG. 2(f). In this conventional updating method, a function (retry function) which operates on the basis of data in the block shown in FIG. 2(d) operates on the basis of the initial value data. Although operation on the basis of the initial value data may not cause a serious malfunction, an unanticipated error is notified to the high-order device 12. For example, although the original correct number of times of magnetic write retry is five times but its number of times is set to be three times as the initial value. As a result, a deteriorated card which is barely capable of writing with four times of retry is judged as a write error after three times of retry and thus the system is suspended because the card is regarded as a card which cannot be used, which results in quality reduction of the system.

On the other hand, according to the method for updating a nonvolatile memory in accordance with this embodiment which is shown in FIGS. 1(a) through 1(h), as described above, an error is notified to the high-order device 12 at the time when the number of times of respective retries is read out and then, a writing command is sent from the high-order device 12 which has received the error and a correct value is set based on the writing command. Therefore, the system operation is prevented from continuing under a state that the number of times of magnetic write retry is three times, which is the initial value, as described with reference to FIGS. 2(a) through 2(f). Further, magnetic write operation is not executed until the number of times of magnetic write retry is reset by the writing command and thus magnetic write operation is executed based on the reset number of times of retry. As a result, a system with high reliability can be realized.

FIG. 3 is a block diagram showing an electrical structure of a card reader 11 (example of the low-order device 11) having a nonvolatile memory in accordance with another embodiment of the present invention. In this embodiment, an EEPROM 112 is used as the nonvolatile memory.

As shown in FIG. 3, the card reader 11 receives an operation execution command from a high-order device (HOST) 12 such as an ATM and executes an operation corresponding to the operation execution command. After that, an operation execution result (response) is returned to the high-order device 12.

An electrical internal structure of the card reader 11 principally includes a CPU 111, an EEPROM 112 and a RAM 113. Further, the card reader 11 also includes a magnetic head for performing transmission/reception of magnetic data with a magnetic card, IC contacts which are abutted with IC terminals on the card to enable reading and writing of data by the CPU 111, a motor for rotationally driving drive rollers, a shutter for controlling entering and ejecting of the card, photo sensors for recognizing a card position and the like. The CPU 111 is incorporated with a ROM for storing information such as control programs and initial values for controlling the card reader.

The EEPROM 112 which is connected with the CPU 111 is capable of retaining stored contents even when power supply is cut off and the content is capable of being electrically rewritten. Further, the EEPROM 112 stores the number of times of shutter opening/closing retry, the number of times of ejection retry when a card detected with the photo sensors is to be ejected, the number of times of take-in retry when a card is to be taken into the card reader as described above.

FIG. 4 is a flow chart showing a method for updating a nonvolatile memory in accordance with an embodiment of the present invention. In FIG. 4, operation in the card reader 11 will be described in detail.

In FIG. 4, it is assumed that the card reader 11 (CPU 111) receives a data updating command from the high-order device 12 (step S1). For example, the card reader 11 receives a command for updating the number of times (four times) of ejection retry to six times as the data updating command. As a result, the CPU 111 reads out data of the block (16 bytes) which includes data to be updated (number of times of ejection retry) from the EEPROM 112 to a working area of the RAM 113 (step S2).

Next, the CRC check is performed (step S3). More specifically, the CPU 111 checks the CRC (Cyclic Redundancy Check) code which becomes an error number string unless data in the block are normally and correctly stored. Any method such as BCC (Block Check Character) or Check-Sum may be used other than the CRC as a method of an error checking.

When the CPU 111 judges that the CRC error has occurred (step S3 NO), the CPU 111 performs the operation of the step S4. Specifically, the CPU 111 updates data to be updated (number of times of ejection retry) of the block data in a working area of the RAM 113 to six times from four times on the basis of the data updating command (step S4).

In addition to the above-mentioned updating based on the data updating command, the CPU 111 rewrites all of data relating to other functions in the working area of the RAM 113 to "0xFF" (step S5). In other words, even when data (for example, number of times of magnetic write retry) other than the data to be updated (number of times of ejection retry) have become wrong value (e.g., five times to twenty times), as described above, the data are rewritten with "0xFF" as one of data other than the data to be updated. In this embodiment, data other than the data to be updated are rewritten with "0xFF". However, any data other than "0xFF" which have no specified meaning, for example, a value which means out of setting region or "0000" may be used.

Next, the CPU 111 recalculates the CRC of the block data in the working area of the RAM 113 (step S6). After having updated to the CRC after recalculated, the block data are written in the original memory area of the EEPROM 112 (step S7). After that, a notice of writing normally finished (notice of data updating normally finished) is sent to the high-order device 11 (step S8). In this embodiment, a case where the notice of data updating normally finished has been sent in the step S8 is expressed as "End A".

In the above-mentioned step S3, when the CPU 111 judges that the CRC error does not occur (step S3: YES), data to be updated of the block data in the working area of the RAM 113 are updated (step S9), the CRC of the block data in the working area is recalculated (step S10), and the block data in the working area are written in the original memory area of the EEPROM 112 (step S11). After that, a notice of the writing normally finished is sent to the high-order device 11 (step S12). In this embodiment, a case where the notice of writing normally finished has been sent in the step S11 is expressed as "End B".

As described above, when the CRC error does not occur in the step S3, a rewriting operation of data other than the data to be updated to "0xFF" is not executed and alternatively, when the CRC error has occurred in the step S3, a rewriting operation of data other than the data to be updated to "0xFF" is executed.

Figure 5:
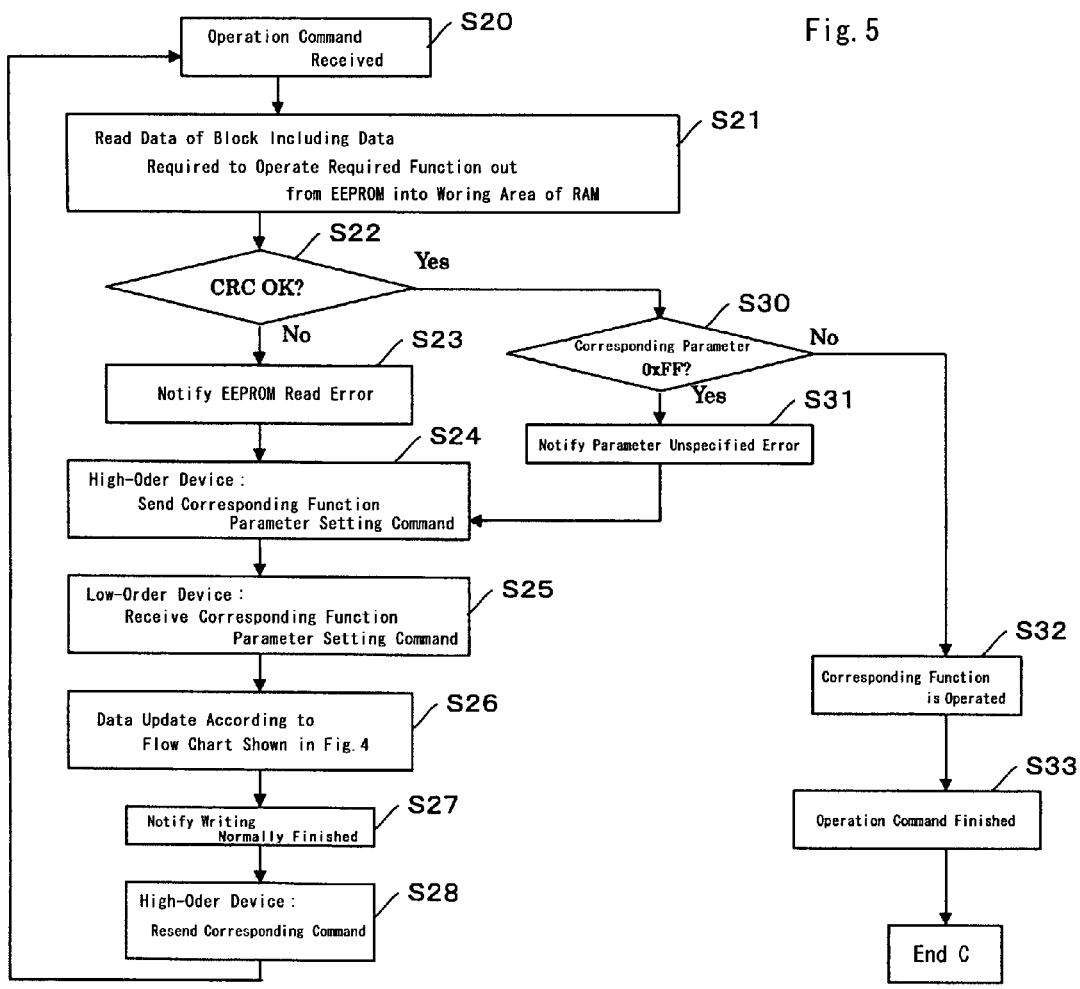
FIG. 5 is a flow chart showing a flow of information processing when a card reader has received an operation command from a high-order device during a system operation has been continued in accordance with an embodiment of the invention.

FIG. 5 is a flow chart showing a flow of information processing when the card reader 11 has received an operation command (for example, magnetic write command) from the high-order device 12 during a system operation has been continued. In FIG. 5, operation in the card reader 11 will be described in detail.

The CPU 111 of the card reader 11 which has received an operation command (step S20) reads out data of the block which includes data (for example, number of times of magnetic write retry) which are required to operate a function to be required (for example, magnetic write function) from the EEPROM 112 to a working area of the RAM 113 (step S21).

Next, the CRC check is performed (step S22). When the CPU 111 judges that the CRC error has occurred (step S22: NO), a notice of read error in the EEPROM 112 is sent to the high-order device 12 (step S23). The high-order device 12 sends a corresponding function parameter setting command to the card reader 11 (step S24).

On the other hand, when the CPU 111 judges that the CRC error does not occur (step S22: YES), the CPU 111 checks whether a parameter of the corresponding function (for example, number of times of magnetic write retry) is "0xFF" or not (step S30). When the parameter is not "0xFF" (step S30: NO), the corresponding function is operated (step S32). For example, a magnetic write operation is executed based on the number of times of magnetic write retry which has been currently stored. Then, the operation command is finished (step S33). In this embodiment, a case where the step S33 is performed is expressed as "End C".

On the other hand, when the parameter is set to be "0xFF" (step S30: YES), the card reader 11 sends a notice of parameter unspecified error to the high-order device 12 (step S31). The high-order device 12 which has received this notice sends a corresponding function parameter setting command to the card reader 11 (step S24). As described above, when the parameter of the corresponding function which is read out from the working area of the RAM 113 is set to be "0xFF", the CPU 111 notifies an unspecified error to the high-order device 12.

When the read error notice (step S23) and the parameter unspecified error notice (step S31) of the EEPROM 112 are sent to the high-order device 12, the high-order device 12 sends a corresponding function parameter setting command to the card reader 11 (step S24). The CPU 111 of the card reader 11 receives the corresponding function parameter setting command as the data updating command shown in FIG. 4. Therefore, the CPU 111 of the card reader 11 which has received the corresponding function parameter setting command from the high-order device 12 (step S25) executes setting of the corresponding function parameter (updating of the corresponding function parameter) according to the procedure, i.e., the flow chart shown in FIG. 4 (step S26). As described with reference to FIG. 4, when writing has been correctly finished (when operations of the step S1 through the step S7 have been finished), the notice of writing normally finished is sent to the high-order device 12 (step S27). The high-order device 12 sends the corresponding command (for example, magnetic write command) again (step S28) and the corresponding command is executed in the CPU 111 of the card reader 11 (step S20). In this case, the CPU 111 reads out again data of the block, which includes data to be updated, from the EEPROM 112 to a working area in the RAM 113 (step S2) and checks the CRC (step 3). This is performed because there is a possibility that a new error condition may occur during a time period between after the notice of the read error (step S23) or the notice of the parameter unspecified error (step S31) has been sent to the high-order device 12 and before the CPU 11 receives the corresponding function parameter setting command from the high-order device 12 to update the data. Alternatively, the step S2 and the step 3 in FIG. 4 are not performed and only the subsequent steps to the step S2 and the step 3 may be performed.

As described above, according to the flow charts shown in FIGS. 4 and 5, system operation is prevented from continuing with the initial values and thus a system with high reliability can be realized. On the contrary, in the conventional updating method, the number of times of magnetic write retry (original specified number of times is five times) has been updated in an initial condition, i.e., the number of times is rewritten to three times (see FIG. 2(d)). Therefore, in a normal case, even when a write error occurs, retry may be repeated by five times under normal circumstances and the write is successfully performed, normal system operation is continued. However, in the conventional updating method, since the number of times is rewritten to three times, after three times of retries, system operation will be suspended. Accordingly, a case may occur in which system operation is suspended and thus reliability of the conventional system has been reduced until the data are re-updated. Further, in the conventional updating method, when operation has been suspended in the middle of the updating procedure, there is a possibility that system operation may be continued under a low reliability condition as described above without realizing this reduced reliability condition. In addition, in a case that the data are a parameter for selecting a standard of an IC card and that the initial setting is different from the standard of an IC card to be treated, when the data are set in the initial setting, an appropriate operation cannot be executed to the corresponding IC card. As a result, an unanticipated error is sent to the high-order device 12 and, at that time, system operation may be suspended.

On the other hand, according to the method for updating a nonvolatile memory in accordance with this embodiment, for example, a corresponding area of the nonvolatile memory is read out for executing magnetic write and, when the CRC of the corresponding area is an error (step S22 in FIG. 5: NO), the read error of the EEPROM is sent to the high-order device 12 (step S23 in FIG. 5). Further, when the CRC of the corresponding area is not an error (step S22 in FIG. 5: YES) and the data are "0xFF" (step S30 in FIG. 5: YES), the parameter unspecified error is sent to the high-order device 12 (step S31 in FIG. 5) and the parameter setting is requested to the high-order device 12. Therefore, a system may be structured in which the high-order device 12, which has received this error notice, sends a command immediately to the card reader 11 for rewriting to normal data (step S24 in FIG. 5) and successively sends a magnetic write command again. Accordingly, continuing operation of the system can be performed without reducing reliability. Further, when an IC card operation is going to be executed, in a case that a parameter unspecified error or an EEPROM parameter read error has occurred, resetting of a parameter relating to an IC card is immediately performed to continuously re-execute data processing of the IC card. Therefore, an interruption of the system does not occur and thus reduction of its reliability can be prevented.

An example of information processing from the operation of the step S20 to the "End C" is as follows. For example, when the CRC is an error after "End B" or no rewriting in FIG. 4, an operation is executed in the order of the step S20→S21→S22(NO)→S23→S24→S25→S26 (steps S1 through S7)→S27→S28→S20→S21→S22(YES)→S30 (NO)→S32 S33→"End C". Further, when rewriting has been performed to reach to the "End A" in FIG. 4 and, when a command other than a command for the parameter which has been rewritten by the process to the "End A" is received and when the CRC is normal, an operation is executed in the order of the step S20→S21→S22(YES)→S30(YES) →S31→S24→S25→S26→S27→S28→S20→S21→S22 (YES)→S30(NO)→S32→S33→"End C". Further, as described above, when the CRC is an error after "End B" or no rewriting in FIG. 4, and when data updating fails in the S26 (steps S1 through S7) or when the CRC becomes an error due to a certain cause before a timing when the CRC check S22 at the time of the next operation command is executed, an operation is executed in the order of the step S23 →S24→S25→S26→S27→S28. Further, when the CRC becomes normal or correct after "End B" or no rewriting in FIG. 4, an operation is executed in the order of the step S20→S21→S22(YES)→S30(NO)→S32 →S33→"End C".

FIGS. 6(a) through 6(h) are explanatory schematic views showing a method for updating a nonvolatile memory in accordance with another embodiment of the present invention.

As shown in FIG. 6(b), a nonvolatile memory in accordance with another embodiment of the present invention stores currently as follows:
IC card standard selection: 1
SAM standard selection: 1
Applied voltage selection: 3

In this state, as an example, it is assumed that, after data of applied voltage have been damaged to change to a wrong value of "5", a writing command for updating the SAM standard from "1" to "2" is sent to the card reader 11 from the high-order device 12 (see FIG. 6(c)). In the card reader 11 which has received the data updating command ("1"→"2"), the CRC check result becomes an error and thus the SAM standard is updated from "1" to "2" and all the parameters except the parameter of the SAM standard are updated to "0xFF" (see FIG. 6(d)). After that, the card reader 11 has written the block contents shown in FIG. 6(d) at a prescribed position in the EEPROM (original memory area) again (see FIG. 6(e)) and then the card reader 11 notifies the high-order device 12 of data updating normally finished (see FIG. 6(f)).

When system operation has been continued with the block contents shown in FIG. 6(d), as an example, it is assumed that an IC card data processing command is sent to the card reader 11 from the high-order device 12. In this case, in order to confirm the standard of the IC card, the IC card standard is read out. However, as described above, "0xFF" is stored in the memory area that stores the IC card standard in the EEPROM and nothing is specified. Therefore, the card reader 11 notifies the high-order device 12 of an unspecified error that means the IC card standard is unspecified (FIG. 6(g)). After that, the card reader 11 sends to the high-order device 12 an error notice which means the operation parameter is unspecified until selections of the IC card standard and an applied voltage have been set (FIG. 6(h)).

As described above, data updating are successively performed until all operation parameters have been updated to normal specified values. Therefore, the card reader 11 is operated based on appropriate (normal) specified parameters and thus system reliability can be enhanced.

The method for updating a nonvolatile memory in accordance with the present invention is effective in an application for enhancing system reliability.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for updating a nonvolatile memory having a memory block which stores a plurality of parameter data which corresponds to a plurality of parameters for controlling operation of a low-order device and which is capable of being updated by a command from a high-order device, and error detection data for detecting whether the plurality of parameter data is correct or not, wherein one of the plurality of parameter data is to be updated to a specified parameter data, said method comprising the steps of
- a first step in which the memory block including the one parameter data to be updated is read to a working area from the nonvolatile memory on a basis of a parameter updating command from the high-order device;
- a second step which detects whether the plurality of parameter data in the memory block that is read through the first step is correct or not on a basis of the error detection data;
- a third step which is executed when an error is detected in the second step to generate temporary updating data, which are not initial values in the memory block, in the working area by updating the one parameter data to be updated to the specified parameter data and by updating data except the one parameter data to be updated to an unspecified data;
- a fourth step which is executed when the error is not detected in the second step to generate normal updating data in the working area by updating only the parameter data to be updated to the specified parameter data;
- a fifth step in which the temporary updating data generated through the third step or the normal updating data through the fourth step are written into the nonvolatile memory; and
- a sixth step which is executed after the fifth step has been finished to notify the high-order device of having finished of the parameter updating.

2. The method for updating a nonvolatile memory according to claim 1, further comprising the steps of:
- a seventh step, which is executed after the sixth step has been finished and on a basis of an operation command sent from the high-order device to operate the low-order device, to read the memory block including an other of the plurality of parameter data for the operation command from the nonvolatile memory into a prescribed working area;
- an eighth step which detects whether the plurality of parameter data in the memory block that is read through the seventh step is correct or not on a basis of the error detection data; and
- a ninth step which judges whether the other parameter data for the operation command is the unspecified data or not;
- wherein, (i) when an error is detected in the eighth step, the low-order device requires a specified parameter data for the operation command to the high-order device and receives and updates to the specified parameter data and data except the specified parameter data to be updated are updated with unspecified data, and (ii) when the other parameter data for the operation command is judged as the unspecified data in the ninth step, the low-order device requires a specified parameter data for the operation command to the high-order device and receives the specified parameter data and updates only the parameter data to be updated to the specified parameter data.

3. The method for updating a nonvolatile memory according to claim 2;
wherein, when an error is detected in the eighth step or when the parameter data for the operation command are judged as the unspecified data in the ninth step, the low-order device requires a parameter data for the operation command to the high-order device, and then the first step, the second step, the third step or the fourth step, the fifth step, and the sixth step are successively executed.

4. The method for updating a nonvolatile memory according to claim 3;
wherein all unspecified data are updated to the specified parameter data for the operation command.

5. The method for updating a nonvolatile memory according to claim 1;
wherein the unspecified data are data of "0xFF".

* * * * *